United States Patent
Castany et al.

(10) Patent No.: US 11,855,038 B2
(45) Date of Patent: Dec. 26, 2023

(54) METHOD FOR ASSEMBLING COMPONENTS IMPLEMENTING A PRE-TREATMENT OF THE SOLDER BUMPS ALLOWING AN ASSEMBLY BY FLUXLESS AND RESIDUE-FREE SOLDERING

(71) Applicant: COMMISSARIAT A L'ENERGIE ATOMIQUE ET AUX ENERGIES ALTERNATIVES, Paris (FR)

(72) Inventors: Olivier Castany, Grenoble (FR); Nohora-Lizeth Caicedo Panqueva, Grenoble (FR); Nadia Miloud-Ali, Grenoble (FR); Yezouma-dieudonne Zonou, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 179 days.

(21) Appl. No.: 17/432,354

(22) PCT Filed: Feb. 20, 2020

(86) PCT No.: PCT/EP2020/054503
§ 371 (c)(1),
(2) Date: Aug. 19, 2021

(87) PCT Pub. No.: WO2020/169743
PCT Pub. Date: Aug. 27, 2020

(65) Prior Publication Data
US 2022/0173069 A1 Jun. 2, 2022

(30) Foreign Application Priority Data
Feb. 20, 2019 (FR) ..................... 1901695

(51) Int. Cl.
*H01L 23/00* (2006.01)
*B23K 1/20* (2006.01)
(Continued)

(52) U.S. Cl.
CPC .............. *H01L 24/81* (2013.01); *B23K 1/206* (2013.01); *H01L 24/13* (2013.01); *H01L 24/16* (2013.01);
(Continued)

(58) Field of Classification Search
CPC ......... H01L 24/81; H01L 24/13; H01L 24/16; H01L 2224/13082; H01L 2224/16145;
(Continued)

(56) References Cited

U.S. PATENT DOCUMENTS 5,865,365 A 2/1999 Nishikawa et al.
2020/0294960 A1* 9/2020 Miyazaki ................ H01L 25/50

FOREIGN PATENT DOCUMENTS

DE 31 44 157 A1 5/1983
EP 0 884 936 A1 12/1998
(Continued)

OTHER PUBLICATIONS

International Search Report dated Jun. 4, 2020 in PCT/EP2020/054503 filed on Feb. 20, 2020 2 pages.

*Primary Examiner* — Douglas W Owens
(74) *Attorney, Agent, or Firm* — Oblon, McClelland, Maier & Neustadt, L.L.P.

(57) ABSTRACT

A method for assembling components includes assembling a first component including solder bumps with a second component including connectors. The assembly of the components is preceded by pre-treating the first and second components wherein the solder bumps are contacted with a pre-treatment liquid configured to at least partially remove an oxide layer initially present on the solder. The pre- (Continued)

treatment liquid is an aqueous solution containing carboxylic acids or polycarboxylic acids. The assembly of the components is carried out after the pre-treatment in the absence of liquid or gas flux.

20 Claims, 6 Drawing Sheets

(51) Int. Cl.
*H05K 3/34* (2006.01)
*B23K 101/40* (2006.01)
(52) U.S. Cl.
CPC ........ *H05K 3/3489* (2013.01); *B23K 2101/40* (2018.08); *H01L 2224/13082* (2013.01); *H01L 2224/13109* (2013.01); *H01L 2224/13111* (2013.01); *H01L 2224/13147* (2013.01); *H01L 2224/13155* (2013.01); *H01L 2224/13166* (2013.01); *H01L 2224/13644* (2013.01); *H01L 2224/16145* (2013.01); *H01L 2224/81011* (2013.01); *H01L 2224/81012* (2013.01); *H01L 2224/81022* (2013.01); *H01L 2224/81075* (2013.01); *H01L 2224/81193* (2013.01); *H01L 2224/81815* (2013.01); *H01L 2924/014* (2013.01); *H05K 2203/0285* (2013.01)

(58) Field of Classification Search
CPC . H01L 2224/81011; H01L 2224/81012; H01L 2224/81022; H01L 2224/81075; H01L 2224/81193; H01L 2224/81815; H01L 2924/014; H01L 2224/85075; B23K 1/206; B23K 2101/40; B23K 2101/42; B23K 1/0016; B23K 1/012; B23K 26/362; H05K 3/3489; H05K 2203/0285; H05K 2203/0789; H05K 2203/0793; Y02P 70/50
See application file for complete search history.

(56) References Cited

FOREIGN PATENT DOCUMENTS

FR          3092959 A1 *  8/2020   ........... B23K 1/0016
WO    WO-2012002273 A1 *  1/2012   ........... B23K 1/0016

* cited by examiner

METHOD FOR ASSEMBLING COMPONENTS IMPLEMENTING A PRE-TREATMENT OF THE SOLDER BUMPS ALLOWING AN ASSEMBLY BY FLUXLESS AND RESIDUE-FREE SOLDERING

TECHNICAL FIELD

The present invention relates to the field of the assembly of electronic devices and more particularly to the field of microelectronics, this assembly allowing an electrical and mechanical connection of components. The invention finds an advantageous, but non-limiting application in the manufacture of microelectronic devices. Microelectronic device means any type of device produced with the means of microelectronics. These devices encompass in particular, in addition to purely electronic devices, micromechanical or electromechanical devices (MEMS, NEMS . . . ) as well as optical or optoelectronic devices (MOEMS, matrix screens, laser chips . . . ).

PRIOR ART

Microelectronic systems are of increasing complexity which implies an increasing number of electrical interconnections between components. It is a known practice to transfer components to other components by means of "solder bumps" serving as connectors for both the mechanical connection and the electrical continuity, and allowing to achieve a high density of connections.

A bump is a protrusion that projects from the surface of a component. A solder is a material fit for soldering, for example tin or indium. Soldering is an operation which allows two objects to be linked by a solder joint. It includes a first temperature rise step during which the solder melts and wets the two objects to be connected, then a temperature drop step during which the material solidifies, leaving a solid solder joint that links the two objects to each other. The solder bumps are, for example, solder balls (typically tin or indium) prepared on metal pads on the surface of the component. In another configuration, these solder bumps include a copper base called a "copper pillar" surmounted by a solder material (typically tin). For bump sizes of less than 50 µm, the term "micro-bumps" can be used.

A first component having solder bumps is intended to be connected to a second component having "connectors" on its surface. The term "connector" means any member having an electrical connection function and/or a mechanical connection function, so that the connection of two connectors produces an electrical conduction function through the two assembled connectors and/or a mechanical securing function allowing the two components to be immovably connected. When the two components are opposite each other during the assembly method, the solder bumps of the first component are facing the connectors of the second component, in order to be connected to each other by a solder joint. The connectors of the second component are for example metal pads. The constitution and structure of these metal pads are typically selected for three aspects: promoting good wetting of the liquid solder on the surface of the pads during the high temperature soldering phase; limiting the diffusion of materials during the high temperature phase and throughout the subsequent life of the product; allowing good adhesion of the solder in the solid state on the metal pad. An example of a commonly used metallisation is the three-layer structure Ti (200 nm)/Ni (700 nm)/Au (100 nm). The situation thus described is a "bumps on pads" assembly where it has been considered that the first component has bumps and the second component has metal pads. However, the notion of first and second component is arbitrary, so that the reverse situation can be considered in an equivalent manner. In a variant, the connectors of the second component are also solder bumps, which corresponds to a "bumps on bumps" assembly.

During the assembly method, the two components are placed facing each other so that the connectors of the components are opposite each other, then the components are brought together until they contact the connectors. Then the assembly is heated so that the solder material melts and establishes a joint between the two connectors, then solidifies when returning to room temperature. This method allows both a unitary assembly of components and a collective assembly of components. A unitary assembly consists in assembling a single component onto a single other component. A collective assembly is the assembly of a plurality of components on another plurality of components with a single thermal cycle for the whole. In this case, the other plurality of components can be a set of components disposed on the work plate of the assembly equipment, or an entire wafer placed on the plate of the assembly equipment (the components may be individualised later by cutting the wafer), or else a set of components placed on an independent plate (which can be removed from the assembly equipment, which allows all the components to be transported at once).

To complete the assembly successfully, an essential detail to be considered is the treatment to be applied to the solder bumps. Indeed, the solder of the bumps is gradually covered with an oxide layer when the components are in contact with an atmosphere containing oxygen, which makes the assembly impossible after a few days of storage in air. The most commonly used treatment method is to deposit a "liquid flux" (solder flux) on the components, then to perform the thermal cycle of assembly and melting of the solder in the presence of this liquid flux. It is known that the role of the liquid flux is to deoxidise the surface of the solder (for example by removing the thin layer of tin oxide if it is a tin-based solder) and to protect the solder from the harmful action of oxygen when operating at high temperature (covering effect), these two effects allowing correct connection of the connectors. In the absence of flux, the mechanical and electrical connections are of poor quality, unreliable, or do not work at all (that is to say, the components are not mechanically attached after the operation). Unfortunately, the use of liquid flux always leaves residues, which penalise the reliability of the connections in the long term (progressive degradation of the connection due to the chemical action of the residues), or penalise the transmission of light between two components (by obstructions of the beams) in the case where the components have an optical function (imagers or photonic chips), or make the infiltration of glue into the gap between the two components random. This last point is important because the assemblies are generally reinforced by gluing the two components. A glue is, for example, infiltrated by capillary action into the gap between the two assembled components, then is thermally polymerised. The purpose is to strengthen the assembly at the mechanical level for its strength, but also to protect the connectors from the external atmosphere, in particular from oxygen and water vapour which have a detrimental effect in the long term if they are directly in contact with the connectors. The polymerised glue between the two components is called underfill. The problem with flux residues is that they prevent the glue from infiltrating in a repeatable and homogeneous manner, and create glue gaps or trap air bubbles, which is a source of fragility for the assembly carried out and its long-term reliability. The fluxes described as "no clean" are advantageous because the residues they leave do not degrade the connections in the long term, and in this sense, it is not necessary to clean them. However, the residues they leave are visible, interfering with optical applications and hinder the infiltration of an underfill.

To avoid these problems, it is necessary to clean flux residues, which is usually done using solvents after assembly and before application of the underfill. Unfortunately, the densification and reduction in the size of the bumps is accompanied by a reduction in the space between the faces of the two assembled components, which complicates the removal of flux residues as it becomes impossible for the cleaning liquid to effectively penetrate the narrow gap between the components.

Therefore, sometimes use is made of gas fluxes, corresponding to the technique called "fluxless" technique, which should be understood as "without liquid flux". These gas fluxes have the advantage of not leaving any residue. The gases used are reducing gases, such as, for example, formic acid (HCOOH) or "forming gas" ($H_2$ diluted in $N_2$). It should be noted that these gases are flammable and/or toxic so a special working environment is required, which is a practical and safety disadvantage. Furthermore, experience shows that their effect is not always proven and reliable, in particular in the case of tin-based solders.

Alternatively, it is possible to pre-treat the solder bumps before assembly and then perform the assembly without liquid or gas flux. Known pre-treatments use gases or plasmas in order to deoxidise the solder surface of the bumps prior to assembly (for example using an SF6 plasma). Unfortunately, these techniques are not sufficiently reliable because experience shows that the assembly efficiency is low. In addition, they require specialised treatment chambers, the implementation of which is expensive.

A further alternative set forth in U.S. Pat. No. 5,865,365 and in patent application EP0884936A1 is to cover the solder bumps with a high boiling point liquid, which acts as a cover during thermal cycling protecting the solder from the damaging action of oxygen. The liquid is selected with a boiling point higher than the melting temperature of the solder, but lower than the maximum temperature of the method, so that it vaporises during the thermal cycle without leaving a residue. It is explained that this liquid is advantageously an alcohol to allow, in addition to the covering effect, to reduce the oxide layer present on the solder. A disadvantage of the method is that this liquid, in order to cover the bumps and perform its function, must fill a large part of the gap between the components to be assembled, which represents a large volume on the scale of the assembly and can cause a relative displacement of the components because of the bubbles which are created during the boiling of the liquid. Another disadvantage is that all the liquid must vaporise without leaving a residue while it is confined between the faces of the assembled components, leaving little passage to escape. It may therefore be necessary to extend the cycle time to give the liquid time to vaporise completely, or even to promote its vaporisation by placing the assemblies in an atmosphere at reduced pressure.

It is therefore an object of the invention to at least partially overcome the disadvantages of current techniques.

SUMMARY

A purpose of the present invention is to provide an assembly method by solder bumps, allowing to assemble a first component including solder bumps with a second component including connectors, said method being characterised in that the assembly of the components is preceded by a pre-treatment of the components wherein the solder bumps are contacted with a pre-treatment liquid configured to at least partially remove the oxide layer initially present on the solder, and in that the assembly of the components is then carried out in the absence of liquid or gas flux, and optionally under an atmosphere of neutral gas such as nitrogen, the pre-treatment allowing effective assembly despite the absence of flux, and without residue.

During the assembly operation, the two components are opposite each other so that the solder bumps of the first component contact the connectors of the second component to form solder joints. The method includes the following steps:

A pre-treatment wherein the components carrying solder bumps are contacted with a pre-treatment liquid which simultaneously allows to remove the oxide layer and the organic contamination which are initially present on the solder of the bumps, and to make possible their soldering later without using a flux.

A contact of the components, without the use of liquid or gas flux, during which the solder bumps of the first component meet the connectors of the second component.

A rise in temperature causing the bump solder to melt and the liquid solder to be wet on the opposite connectors.

A drop in temperature allowing the solder joints to solidify, so that each solder bump of the first component is linked by a solid solder joint to the connector facing it on the second component.

According to one embodiment, the pre-treatment liquid is a solution containing a basic detergent, the pH of said solution preferably being comprised between 11 and 13.

According to one embodiment, the pre-treatment liquid is a solution containing an acid detergent, the pH of said solution preferably being comprised between 1 and 3.

According to one embodiment, the detergent is preferably non-foaming, the contact with the pre-treatment liquid can be made by immersion and for example in an ultrasonic bath, the contact time with the pre-treatment liquid is preferably comprised between 1 and 5 minutes, the contact with the pre-treatment liquid is followed by rinsing, carried out for example with water or isopropanol, then by drying, the assembly by soldering then preferably being carried out less than one hour after the pre-treatment and preferably under a neutral gas atmosphere.

According to one embodiment, the pre-treatment liquid is configured to leave a thin film on the surface of the treated components, with a thickness preferably less than 100 nm, this film having the property of promoting effective soldering without leaving residues after assembly, and allowing the action of the pre-treatment to be prolonged so that the soldering can be done more than one hour after the pre-treatment without reducing the assembly efficiency.

According to one embodiment, the pre-treatment liquid is an aqueous solution containing carboxylic acids or dicarboxylic acids or more generally polycarboxylic acids, and which may advantageously contain amines or diamines or more generally polyamines, and which may in an even more advantageous manner contain amino acids or di-amino acids or more generally poly-amino acids, which combine the carboxylic acid and amine functions.

According to one embodiment, the pre-treatment liquid is an aqueous solution containing glutamic acid hydrochloride, in a concentration preferably comprised between 10 and 20% by mass.

According to one embodiment, the pre-treatment liquid also contains a strong acid, the latter allowing to promote the deoxidation of the solder. In its potential combination with glutamic acid hydrochloride, this acid allows to stabilise glutamic acid hydrochloride. This strong acid is, for example, hydrochloric acid, with a concentration comprised between 0.1% and 1%, preferably of the order of 0.4% by mass. If the strong acid is a strong acid other than hydrochloric acid, its amount is adjusted so that the pH of the pre-treatment liquid is less than 2.

According to one embodiment, the pre-treatment liquid also contains an acid detergent, allowing in particular to improve the wetting of the pre-treatment liquid on the components and in particular on the solder bumps.

According to one embodiment, the components are rinsed immediately after contact with the pre-treatment liquid with a good solvent allowing to dissolve the solutes present in the pre-treatment liquid at an amount of at least 10%, so that only an adsorbed molecular film remains on the solder, said good solvent being for example water.

According to one embodiment, the components are rinsed immediately after contact with the pre-treatment liquid with a poor solvent allowing not to dissolve more than 0.1% of the solutes present in the pre-treatment liquid, so that a thin film of nanometric thickness, preferably comprised between 1 and 100 nm, remains on the treated components and in particular on the solder bumps, said poor solvent being for example isopropanol.

According to one embodiment, the components are dried immediately after contact with the pre-treatment liquid, so as to leave a film of material, then are optionally washed with a poor solvent from the solutes present in the pre-treatment liquid, so as to reduce the thickness of the film left on the component after the first drying, to achieve the desired thickness, said poor solvent being for example isopropanol.

According to one embodiment, the contact with the pre-treatment liquid can be made by immersion and for example in an ultrasonic bath, the contact time with the pre-treatment liquid is preferably comprised between 1 and 5 minutes, the assembly by soldering then preferably being carried out less than four hours after the pre-treatment, in the presence of air or under neutral gas.

The invention advocates the use of a pre-treatment liquid, the benefit of which is to be able to then assemble the components by soldering without using liquid or gas flux, without leaving any residue, and with good assembly efficiency. In comparison, current techniques focus on the local application of liquid flux (which leaves problematic residues), or the use of gas flux (which require special equipment and a secure environment). The method of the present invention constitutes a technical advance over existing techniques which do not produce this synergy of favourable features.

BRIEF DESCRIPTION OF THE FIGURES

The figures are given by way of non-limiting examples, to serve as an explanatory support for the detailed description which follows.

FIG. 2a shows the situation before assembly.

The drawings are given by way of example and are not limiting of the invention. They constitute schematic principle representations intended to facilitate the understanding of the invention and are not necessarily on the scale of practical applications.

DETAILED DESCRIPTION

The present invention is a method for assembling components involving a pre-treatment of the solder bumps allowing a fluxless and residue-free solder assembly. First, the method for assembling the components will be described, then the method for pre-treating solder bumps will be described in detail, which is the heart of the invention.

The assembly method involves assembling a first component carrying solder bumps with a second component carrying connectors. During the assembly operation, the two components are opposite each other so that the solder bumps of the first component contact the connectors of the second component to form solder joints.

Figure 1:
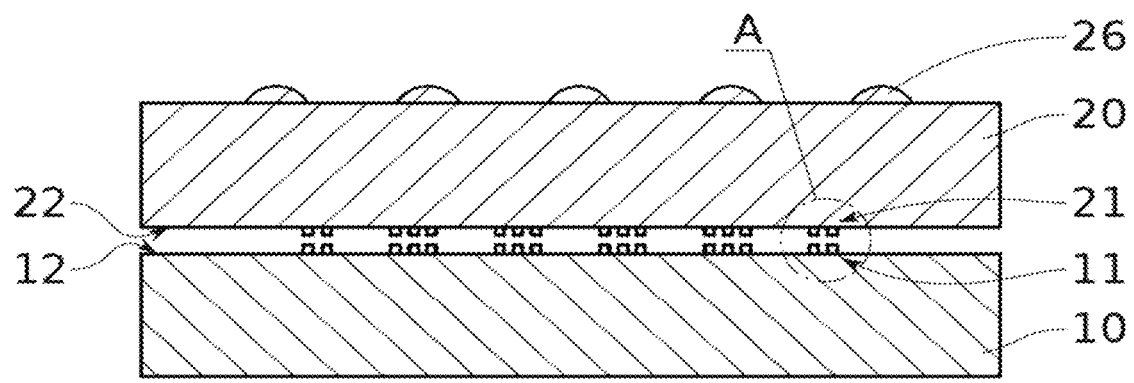
FIG. 1 shows a schematic view of two components 10 and 20 intended to be assembled.
Figure 2A:
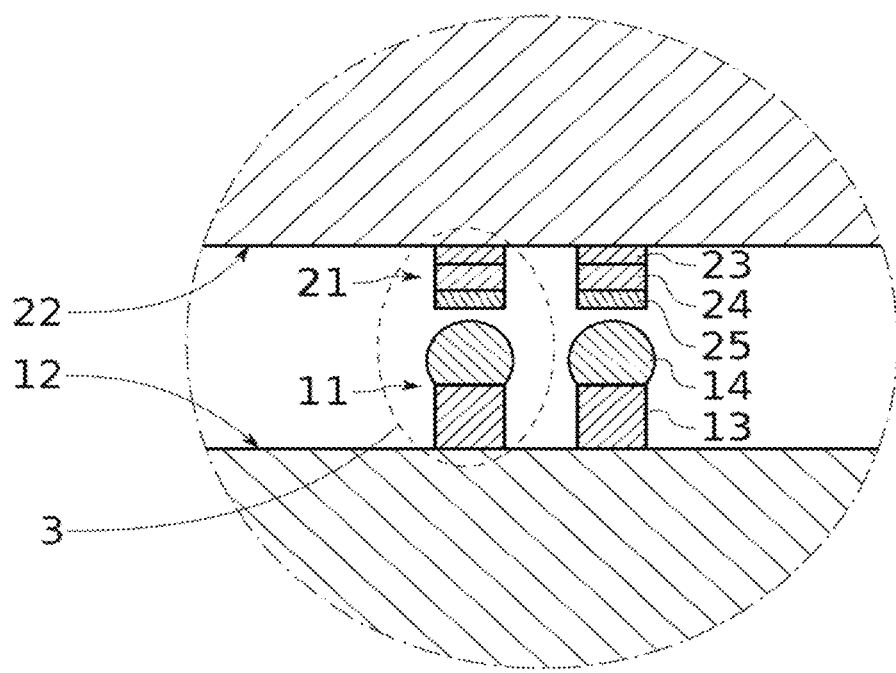
FIG. 2a is a detail of FIG. 1 showing an exemplary embodiment of the connectors, with on the one hand solder bumps 11 on the component 10 and on the other hand metallisation pads 21 on the component 20.

FIGS. 1 and 2a provide a schematic example of components to be assembled. A first component 10 is visible in the lower part of the drawings and may for example come from a substrate made of a semiconductor material such as silicon, or of monocrystalline sapphire, or of glass. A second component 20, which may or may not be of the same type, is superimposed thereon for assembly. A face 12 of the first component 10 is thus opposite a face 22 of the other component 20.

All types of components used in microelectronics are covered by the invention when they involve an electrical and/or mechanical connection by solder bumps present on at least one of the two components. Functional elements may be present on each component and, by way of illustrative example, optical functions 26 carried by the face of the second component 20 opposite to the face 22, were shown. The optical functions 26 can be microlenses present on a glass or silicon substrate 20 while the first component 10 can be a photonic interposer.

The term "connector" means any member having an electrical connection function and/or a mechanical connection function, so that the connection of two connectors produces an electrical conduction function through the two assembled connectors and/or a mechanical securing function allowing the two components to be immovably connected. Thus, the "solder bumps" are an example of connector type and the "metal pads" are another example of connector type.

To carry out the assembly, the two components are facing each other so that the connectors of the components are opposite each other, then the components are brought together until they contact the connectors. It is possible to carry out the unitary assembly of a single component on another single component, or to carry out a collective assembly of a plurality of components on another plurality of components. A unitary assembly consists in assembling a single component onto another single component. A collective assembly consists in assembling a plurality of components on another plurality of components with a single thermal cycle for the whole. In this case, the other plurality of components can be a set of components disposed on the work plate of the assembly equipment, or an entire wafer placed on the plate of the assembly equipment (the components may be individualised later by cutting the wafer), or else a set of components disposed on an independent plate (which can be removed from the assembly equipment, which allows all the components to be transported at once). Note that often, the manufacture of the components 20 ends with a cut where the components are individualised and left on an adhesive film with their face 22 facing upwards. The positioning of the component 20 on the component 10 therefore requires an inversion of the component so that the face 22 is facing downwards, this technique usually being called "flip-chip".

The present invention relates specifically to the assembly of components by means of solder bumps present on at least one of the two components and having the function of a connector. During assembly, the solder bumps present on one of the components are facing the connectors present on the other component, to be connected to each other by a solder joint. In the example illustrated in FIGS. 1 and 2a, the component 10 includes solder bumps 11 and the component 20 includes metal pads 21. FIG. 2a is a detail view of the structure of the connectors before their assembly. It should be borne in mind that the connector 21 could be a type of connector other than a metal pad, for example it could be a solder bump, which would correspond to a bump on bump assembly. However, the most common situation was selected to be represented, which is that of a bump on metal pad assembly.

The solder bump 11 is formed, for example, of a copper pillar 13 and a solder material 14 which is typically a tin alloy. For this type of bump, called "copper bump", the solder material is generally produced by electrolysis in the shape of a straight block, then a passage at high temperature melts the soldering material, so that the capillary forces in the liquid give the solder a convex shape, which is retained after cooling. The assembly 11 can have a total height of the order of 2 to 100 micrometres, where the height of the base is for example half of the total height. The space between two neighbouring bumps 11 on the same component can range from 5 to 200 micrometres typically. In general, solders made of tin as mentioned above, or indium (generally in the shape of balls without copper pillar), or an alloy based on these materials can be considered. It could also be a lead alloy, but this example is not preferred given the regulatory restrictions on its use.

The connector 21 is for example a metal pad which comprises, in the case drawn, three superimposed layers. The lower layer 23 is for example made of titanium with a thickness of the order of 200 nm; the intermediate layer 24 is for example made of nickel with a thickness of the order of 700 nm; the upper layer is in particular made of gold with a thickness of the order of 100 nm.

Figure 2B:
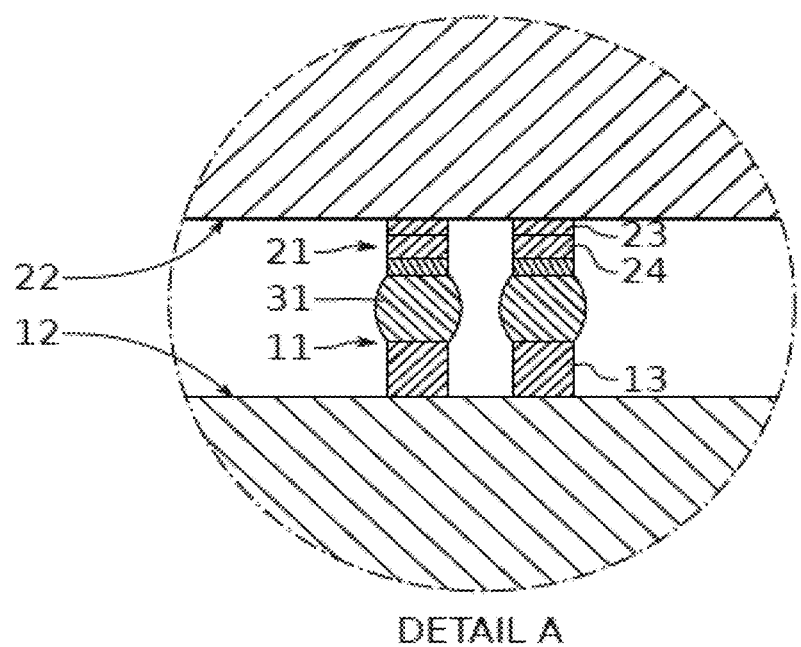
FIG. 2b shows the situation after assembly, where solder joints 31 link the connectors 11 and 21.

During assembly at high temperature, the solder of the bump turns to the liquid state, and being in contact with the metal pad, will wet the surface of this pad. The role of the gold layer on the surface of the pad is to promote good wetting, then it is gradually dissolved in the volume of solder and will form an intermetallic compound. After cooling, the pair of connectors 3, composed of a solder bump 11 and a metal pad 21, forms a solid solder joint 31 shown in FIG. 2b. The gold layer 25 was removed from the diagram because the gold was included as an intermetallic in the solder joint that was formed.

The temperature profile used is typically 250° C. for one minute for a tin-based solder, and 190° C. for one minute for an indium solder, which corresponds to a temperature of around 30° C. above the melting temperature of the tin or indium solder, giving a sufficient safety margin to ensure that the solder melting conditions are reached. The following paragraphs describe the detail of the assembly method with regard to the placement of components and the application of the temperature profile. This can be achieved in various ways known in the prior art, using assembly equipment available in the field of microelectronics.

A first way to do this is to hold each component so that they are facing each other and closer together during the application of the temperature profile. In general, the dispersion of the height of the bumps and the metal pads on the supplied components, as well as the lack of flatness of the components, does not allow all the pairs of connectors 3 to be contact simultaneously. Only a fraction of the pairs of connectors are initially in contact and by their mechanical resistance prevent a closer approximation of the components and therefore of the other pairs of connectors. When the temperature profile is applied, the solder of the bumps melts and wets the opposite connector for the pairs that are initially in contact. To connect pairs of connectors that were not initially in contact, the assembly equipment is programmed to tend to bring the connectors together, for example by asking it to apply a certain force. As the solder of the bumps melts, its mechanical strength decreases, allowing the components to be brought together under the force applied, thus allowing all pairs of connectors to be contacted and connected. The person skilled in the art will know how to choose the correct force, sufficient to allow all connectors to be connected, but still limited to avoid pressing too hard and to avoid expelling the liquid solder on the side of the bumps.

A second way to do this is to hold the component 10 stationary, align the component 20 above the component 10, then rest it on the component 10, and release it so that it is no longer held. When the temperature profile is applied, the solder from the bumps melts and wets the opposite connector for the pairs that are initially in contact. The geometry of the solder, initially convex like a spherical cap, tends to take a barrel shape after wetting the opposite pad, at the same time as the capillary forces in the liquid solder tend to reduce the gap between the surfaces 12 and 22 which are opposite each other during the method. This approximation effect is significant because the dispersion of the heights of the bumps and of the pads on the components to be treated, as well as the flatness defects of the components, do not allow all the pairs of connectors 3 to be initially in contact. Although only a fraction of the pairs 3 are initially in contact, the wetting of the solder and the associated capillary forces cause an approximation which gradually contacts the other pairs of connectors, resulting in the formation of joints for all the pairs of connectors. It may however happen that the dispersion of the heights of the bumps and of the pads on the supplied components is too great, and that the approximation of the components thanks to the wetting of the solder does not allow to make up for all the differences in height. In this case, it may be useful to proceed, before the temperature assembly step, to a step of levelling the solder bumps, called "coining", during which the two components with their connectors opposite each other are pressed one on the other with sufficient force to allow the plastic deformation of the solder and its levelling. This levelling of the solder bumps can also be done by resting the bumps against a flat plate. Solder materials generally lend themselves well to this levelling step because they are ductile materials. An advantage of the method which has just been described, wherein the top component is not held during the high temperature step, is that this component can align itself thanks to the capillary forces of the liquid solder, in the sense that these forces tend to bring the connectors 21 to the vertical of the connectors 11. This self-alignment effect allows to achieve an alignment precision of less than a micrometre even if the top component was previously placed with a coarser precision, characterised by an uncertainty of several microns. On the other hand, in the case of a collective assembly, the method which has just been described allows to deposit a plurality of components 20 on a plurality of components 10, then to perform a single thermal cycle to assemble all these components at the same time thanks to a collective melting of the solder of the bumps.

The present invention is a method for assembling components using a pre-treatment of the solder bumps allowing a fluxless and residue-free solder assembly. After having described the assembly method in the preceding paragraphs, the pre-treatment method which constitutes the heart of the invention will now be described. As explained in the technological background, a treatment of the solder bumps is essential to achieve proper solder joint formation and to achieve good assembly efficiency. The most common treatment is to apply liquid flux to the components before assembling them, unfortunately this method leaves flux residue after assembly. These residues are acceptable in some situations but unacceptable in other situations. For this discussion, reference is made to the technological background reading. The present invention provides a pre-treatment method to be carried out before assembly of the components and the benefit of which is to be able to then carry out the assemblies without using liquid or gas flux.

Prior to the actual assembly, the present invention involves contacting the components carrying solder bumps with a pre-treatment liquid. This contact is for example made by immersing the components in the pre-treatment liquid, the important thing being that the solder bumps are in contact with the liquid. The formulation of the pre-treatment liquid is chosen so that the contact time is preferably comprised between 1 and 5 minutes, to be compatible with industrial rates while allowing precise control of the treatment time. The application of ultrasound in the pre-treatment liquid may be useful in improving the homogeneity of the treatment on the components and decreasing the contact time required to achieve the expected benefit of the pre-treatment. The components are then rinsed and dried before proceeding with their assembly.

A first formulation of pre-treatment liquid consists in using a basic detergent solution, the pH of which is preferably comprised between 11 and 13. According to this recommendation, an example named PRE-TREATMENT LIQUID N° 1 and formed by diluting the basic detergent TFD7 from the company Franklab at 3% in water, is considered. It is an aqueous solution of pH 12. The detergent used is based on EDTA (Ethylenediaminetetraacetic), sodium pyrophosphate and potassium hydroxide.

A second formulation of the pre-treatment liquid consists in using an acid detergent solution, the pH of which is preferably comprised between 1 and 3. According to this recommendation, an example named PRE-TREATMENT LIQUID N° 2 and formed by diluting the acid detergent Neutrax PF from the company Franklab at 3% in water, is considered. It is an aqueous solution of pH 3. The detergent used is based on acetic acid and citric acid.

Figure 3A:
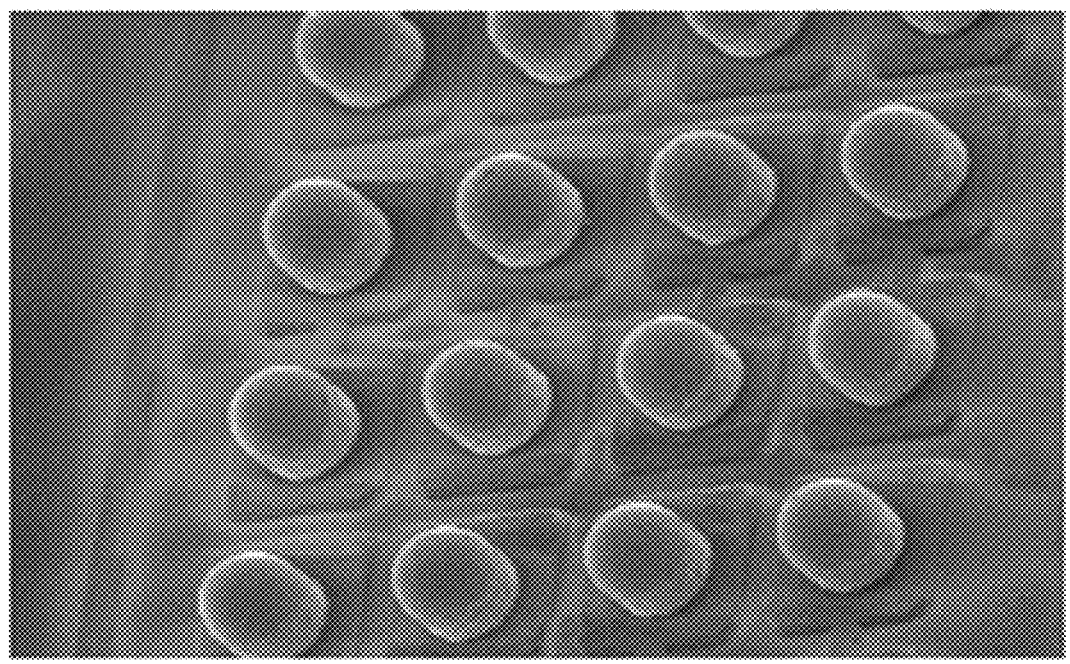
FIG. 3a shows an electron microscope image of the solder bumps of test vehicle no 1 discussed in the text.
Figure 3B:
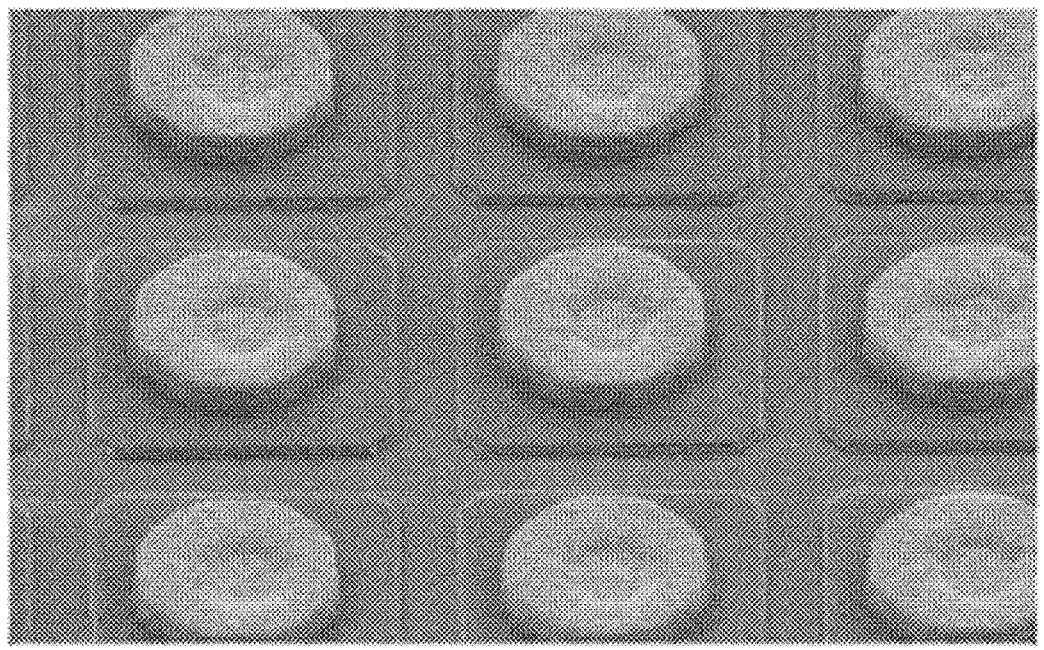
FIG. 3b shows an electron microscope image of the metallisation pads of test vehicle no 1 discussed in the text.

To test and compare the different methods, a TEST VEHICLE N° 1 formed of two silicon chips to be assembled on top of each other was used. The first chip includes solder bumps which are copper pillars surmounted by a tin-based solder (Sn 98%, Ag 2%). The pillars have a diameter of 25 µm and are disposed in a square network with a pitch of 50 µm. The height of the copper pillars is 12 µm and the solder forms a dome 11 µm in high at the top of the pillars. The size of this first chip is 5 mm by 6 mm, with a thickness of 200 µm. The second chip includes metallisation pads 27 µm in diameter formed by a 3 µm thick layer of nickel surmounted by a surface layer of gold. The arrangement of the metallisation pads on the second chip coincides with the arrangement of the solder bumps of the first chip, to allow them to be assembled when the chips are opposite each other. The second chip is 11 mm by 11 mm, with a thickness of 725 µm. It is larger than the first chip, to allow easier handling during testing, and will be placed below the first chip during assembly. Images of the two chips obtained by scanning electron microscopy are presented in FIG. 3 and show the connectors of the two chips. The left image shows the solder bumps, and the right image shows the metallisation pads.

In EXAMPLE N° 1, the pre-treatment of the chips of the test vehicle N° 1 is carried out. The chips that include solder bumps are immersed in the pre-treatment liquid no 1 or no 2 for 3 minutes in an ultrasonic bath. They are then rinsed with water and then dried with a nitrogen blast. The solder bumps are then observed under an optical microscope, under an electron microscope and their height before and after the pre-treatment is measured using an interferometric optical profilometer. Observation under the optical microscope and the electron microscope does not show any visible change as a result of the pre-treatment. By measuring the height of the top of the bumps before and after pre-treatment, a slight decrease in the average height of the bumps, of the order of 10 to 20 nm is observed. This value is very low compared to the height of 11 µm of the solder of the bumps, and all the observations allow to conclude that the pre-treatment with liquids no 1 or no 2 under the conditions of this example does not degrade the solder bumps.

The detergents are preferably of the non-foaming type to allow rapid and effective rinsing, and this is the case of the detergents used for pre-treatment liquids no 1 and no 2.

Figure 4A:
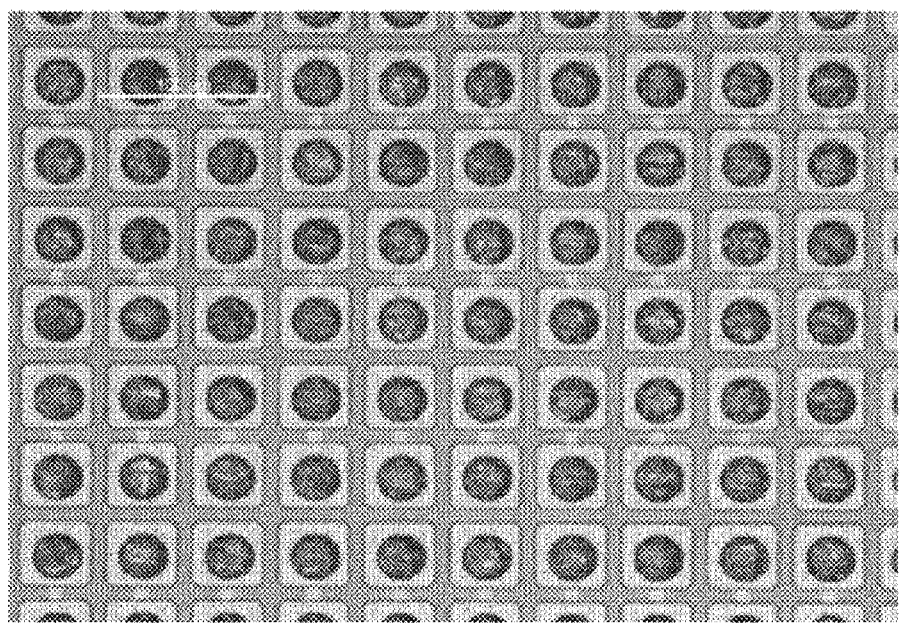
FIG. 4a shows the surface of chips including metallisation pads, photographed after assembly and dismounting of the assemblies, in order to determine the quality of the assembly.
Figure 4B:
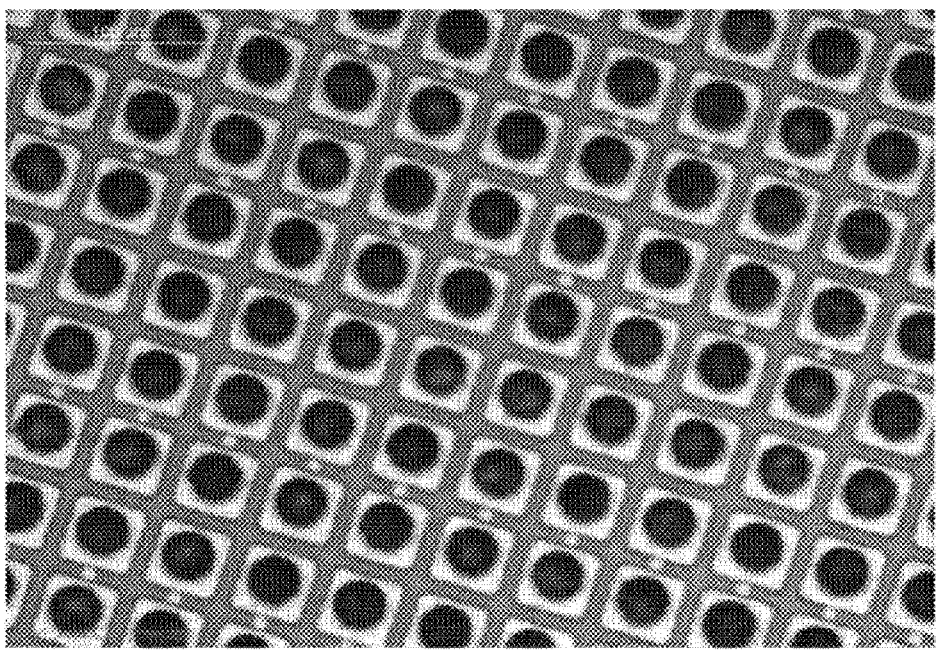
FIG. 4b shows another case of chip surface.
Figure 4C:
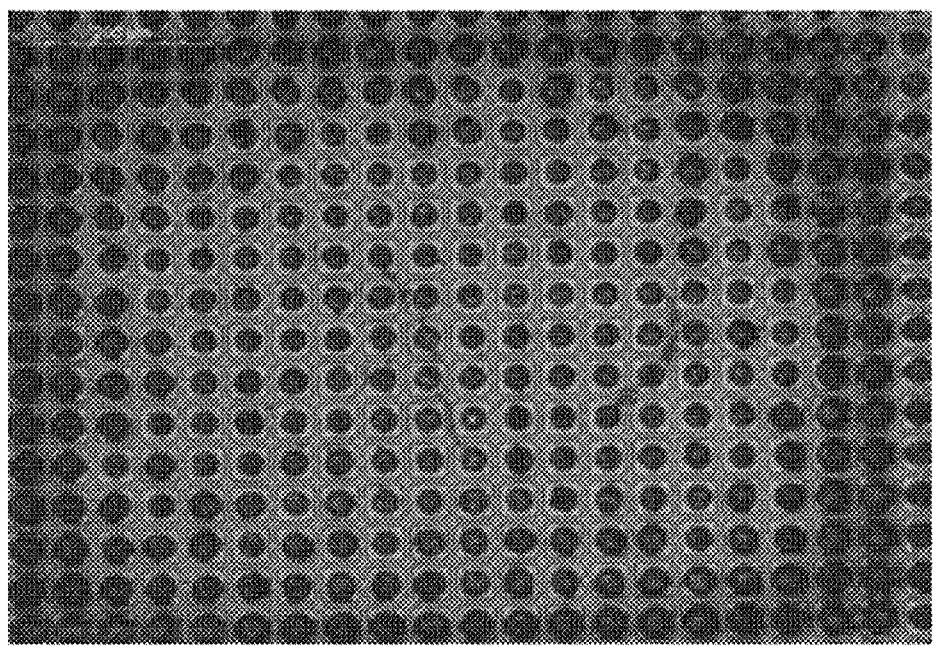
FIG. 4c shows another case of chip surface.

In EXAMPLE N° 2, the pre-treatment of the chips of test vehicle no 1 is carried out in the same way as in Example no 1, then their assembly is carried out by soldering by the following operations within a period of less than one hour after pre-treatment. The chip including the solder bumps is positioned above the chip including the metallisation pads with a precision of 5 µm or better, then a cold press is performed to level the solder of the bumps relative to the metallisation pads (see above the discussion on this "coining" method). The top chip is then released and a thermal cycle is carried out with a rise in temperature to 250° C. which allows the melting of the solder and its wetting on the opposite metallisation pads, the operation being carried out under an inert atmosphere of nitrogen. After cooling, the assemblies are dismounted by laterally pushing the top chip while keeping the bottom chip stationary to generate a shear stress to separate the two chips. An optical microscope observation of the connectors of the two chips after their separation allows to determine whether the pairs of connectors had formed correct solder joints or if some pairs were not connected after the method. In particular, observing the appearance of the metallisation pads after dismounting allows to clearly know whether a solder joint before wet and adhered to the pad. Indeed, if this is the case, the solder remains partially attached to the pad after dismounting, and if this is not the case, the gold layer remains visible on the pad. The photo in FIG. 4a corresponds to the chip including the metallisation pads after the following operations: pre-treatment with pre-treatment liquid no 1, assembly as mentioned above in this example, then dismounting. It can be seen that all the pads visible on this photo have been properly wetted. Chips are declared being assembled correctly when all connector pairs have formed correct solder joints. With the method described in this example, whether using pre-treatment liquid no 1 or with liquid no 2, it is observed that a 100% assembly efficiency is achieved.

Figure 4D:
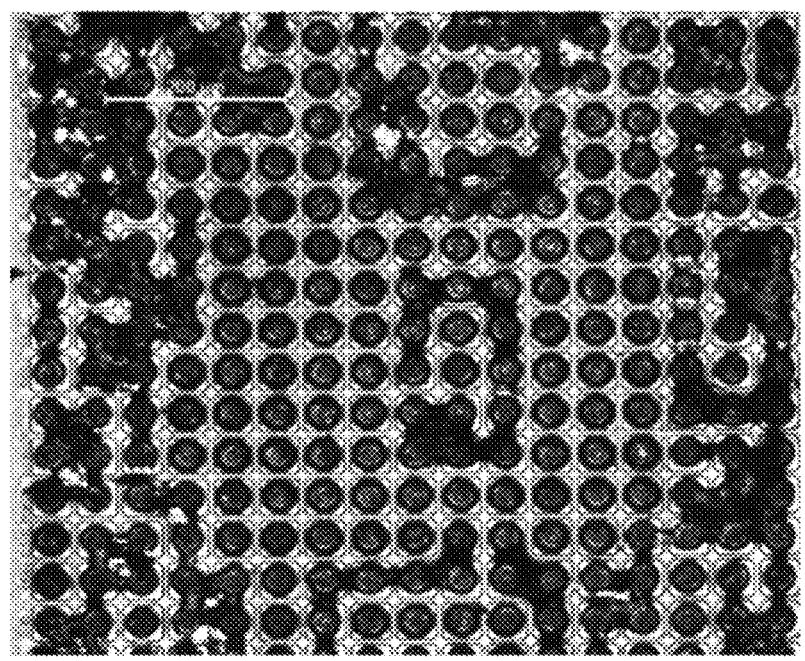
FIG. 4d shows another case of chip surface.

For comparison purposes, the chips of the test vehicle no 1 are also assembled using other solder bump treatment methods. In a first comparative example, the pre-treatment liquid will be replaced by an aqueous solution of hydrochloric acid at 0.1 mol/L. In a second comparative example, the assembly will be carried out under a reducing atmosphere containing formic acid vapour diluted in nitrogen at two different concentrations. In a third comparative example, liquid fluxes of the "ORL0" and "ORM1" type will be used, corresponding to increasing activities according to the classification of standard IPC-J-STD-004. Other than that, the chip assembly method will remain the same as in the example no 2, with the same temperature profile and the same test to determine the chip assembly efficiency. The results obtained are given in the table below. The amount of residues mentioned is a qualitative evaluation given from the visual observation of the chips, some examples of which are shown in FIG. 4, in particular the photo 4a corresponds to the use of pre-treatment liquid no 1, photo 4b corresponds to the use of formic acid vapour at 2%, photo 4c corresponds to the use of a liquid flux "ORL0", and photo 4d corresponds to the use of a liquid flux "ORM1". It is observed that hydrochloric acid does not allow to achieve the same benefit as the pre-treatment liquids no 1 and no 2 because under identical experimental conditions it does not allow to assemble the chips by repeatedly forming solder joints for all pairs of connectors, that is to say there are always unconnected pairs (around 20%). It is observed that formic acid vapour at a concentration of 8% allows an assembly as effective and clean as with the two pre-treatments. On the other hand, gas formic acid is a flammable and toxic gas, its use requires special equipment and gas detectors to ensure the safety of the working environment. In comparison, the method of the present invention has the advantage of not having these disadvantages while giving the same quality of result. Regarding the use of liquid fluxes, it is noted that only the use of a sufficiently active flux allows to obtain an assembly efficiency of 100%, but that this method leaves a large amount of flux residues as can be seen in FIG. 4d. In comparison, the method of the present invention has the advantage of leaving the surfaces clean without residue.

TABLE 1

| Method | Assembly efficiency | Amount of residues |
|---|---|---|
| Pre-treatment liquid no 1 | 100% | 0 |
| Pre-treatment liquid no 2 | 100% | 0 |
| Pre-treatment HCl 0.1 mol/L | 0% | 0 |
| Formic acid vapour 2% | 20% | 0 |
| Formic acid vapour 8% | 100% | 0 |
| Liquid flux "no clean" ORL0 | 60% | 1 |
| Liquid flux "no clean" ORM1 | 100% | 2 |

Figure 5:
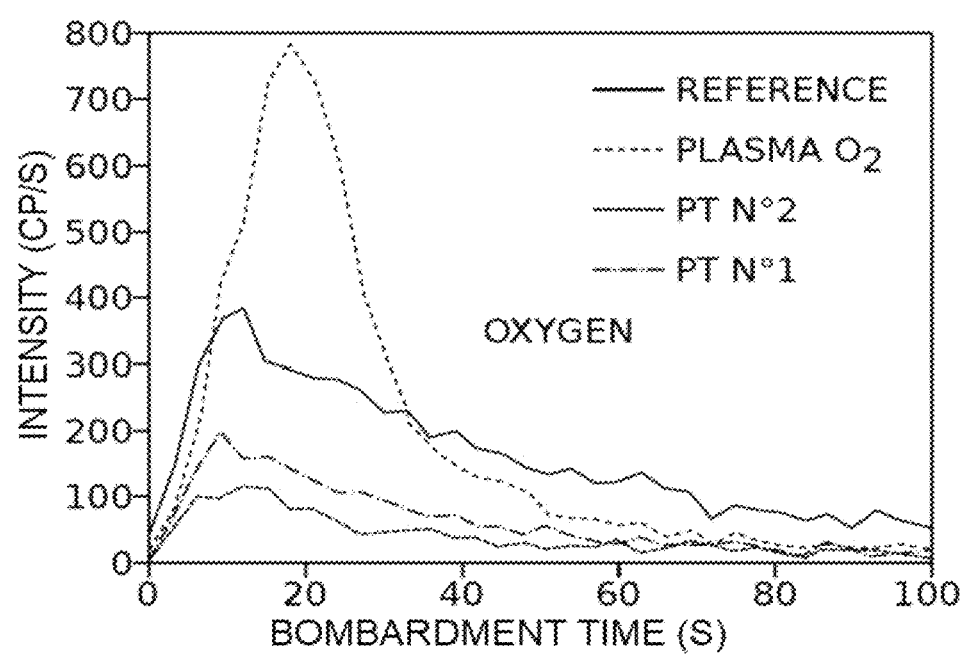
FIG. 5 shows the ToF-SIMS analysis curves giving the amount of oxygen as a function of depth for solder bumps that have undergone different treatments.

To determine the physicochemical action of the treatments carried out on the solder of the bumps, the ToF-SIMS ("Time of Flight-Secondary Ion Mass Spectroscopy") technique was used, which consists in hollowing out the surface of the sample by an ion bombardment ($Cs^+$ in this case) and in analysing the ions coming from the sample and ejected by this bombardment. This technique allows the chemical composition of the sample to be determined based on the depth of abrasion. FIG. 5 shows the result obtained for the measurement of oxygen at the surface of the solder of the chips of test vehicle no 1. Different samples are analysed: an untreated reference sample, a sample treated with an oxygen plasma (RIE), and two samples treated with pre-treatment liquids no 1 and no 2 according to the method described in example no 1. It is observed that the pre-treatment liquids have the effect of greatly reducing the amount of oxygen initially present on the surface of the solder. A similar analysis can be carried out for the measurement of carbon at the solder surface and it is observed that the two pre-treatment liquids also have the effect of greatly reducing the carbon contamination initially present at the surface of the solder. This carbon contamination is organic contamination that simply builds up by leaving chips in the air, even in the atmosphere of a clean room. It can therefore be observed that the action of pre-treatment liquids no 1 and 2 reduces the thickness of the oxide layer and reduces carbon contamination on the surface of the solder. In comparison, oxygen plasma also has this effect, but it reduces the thickness of the oxide layer less, which does not make it an effective pre-treatment. In comparison, a pre-treatment with hydrochloric acid as discussed above is also not a good pre-treatment because if it decreases the oxide thickness well, it is less effective in removing carbon contamination. It is therefore the combined effect of the corrosive action on the oxide layer and the reduction of carbon contamination that allows the pre-treatment of the invention to be effective.

Then, a TEST VEHICLE N° 2 formed of two silicon chips to be assembled on top of each other is considered. The first chip includes solder bumps which are indium balls 15 µm in diameter, disposed in a square array with a pitch of 30 µm. The second chip includes metallisation pads formed by a 50 nm titanium layer, a 250 nm platinum layer, and a 100 nm surface layer of gold. The arrangement of the metallisation pads on the second chip coincides with the arrangement of the solder bumps of the first chip, to allow them to be assembled when the chips are opposite each other.

In EXAMPLE N° 3, the pre-treatment of the chips of the test vehicle N° 2 is carried out. The chips which include solder bumps are immersed in pre-treatment liquid no 2 for 3 minutes in an ultrasonic bath. They are then rinsed with water and then dried with a nitrogen blast. An observation of the solder balls under an optical microscope shows that they are not degraded by this treatment. The two chips of test vehicle no 2 are then assembled by soldering by the following operations within a period of less than one hour after the pre-treatment. The chips are opposite each other with a precision of 5 µm or better, then a cold pressing is carried out to level the solder of the bumps relative to the metallisation pads (see the discussion above on this "coining" method). The top chip is then released and a thermal cycle is carried out with a rise in temperature to 200° C. which allows the melting of the indium solder and its wetting on the opposite metallisation pads, the operation being carried out under an inert nitrogen atmosphere. After cooling, the assemblies are disassembled and the chips are inspected to determine the good wetting of the solder as explained in Example no 2. It can be seen that the method allows to achieve an assembly efficiency of 100%, in the sense that all pairs of connectors form correct joints. This shows that the pre-treatment of the present invention is also effective on indium solders.

The invention therefore ensures both an assembly by optimal soldering (assembly efficiency of 100%) and a very good quality surface finish on the entire component (which is an advantage over liquid fluxes), while avoiding the use of flammable or toxic gases (which is an advantage over gas or plasma treatments).

The duration of the effect of pre-treatment liquids no 1 and no 2 is typically of the order of one hour, that is to say that the assembly should preferably be carried out within one hour after pre-treatment. To increase this duration, pre-treatment liquids have been developed which allow to leave a thin film on the surface of the treated components, with a thickness preferably less than 100 nm, this film having the property of promoting effective soldering without however leaving residues after assembly. In particular, aqueous solutions containing carboxylic acids, dicarboxylic acids, or more generally polycarboxylic acids are advantageous. Indeed, carboxylic acids are corrosive due to their acid function and their use in pre-treatment therefore allows to reduce the thickness of the oxide layer initially present on the solder. But also, the carboxylic acid group has the possibility of adsorbing on the surface of the solder by complexation, to then express itself as a reducing agent during the rise in temperature during assembly (in a similar manner to the action of hot vapour formic acid). The solution may advantageously contain amines, diamines or more generally polyamines, which are known as catalysts by virtue of their complexing effect. More advantageously, the solution may contain amino acids or di-amino acids, which combine the carboxylic acid and amine functions. In particular, it is advantageous to consider an aqueous solution containing glutamic acid hydrochloride, in a concentration preferably comprised between 10 and 20%. It is also advantageous to add a strong acid to promote deoxidation of the solder, and also to stabilise the glutamic acid hydrochloride.

According to these recommendations, an example named PRE-TREATMENT LIQUID N° 3 consisting of an aqueous solution containing 14% of glutamic acid hydrochloride and 0.4% of hydrochloric acid is considered. Hydrochloric acid is a strong acid which allows, on the one hand, to accentuate the corrosive nature of the pre-treatment liquid and therefore its ability to dissolve the oxide layer initially present on the solder, and on the other hand to stabilise the glutamic acid hydrochloride. Indeed, if a non-acidified glutamic acid hydrochloride solution is left in the air, some of the hydrogen chloride in the hydrochloride will gradually evaporate, which decreases the acidity and allows the glutamic acid to precipitate. Acidifying the solution therefore allows to stabilise it by preventing it from precipitating, which is a practical advantage in terms of shelf life and implementation.

In EXAMPLE no 4, the chips of the test vehicle no 1 are immersed in the pre-treatment liquid no 3 for 5 minutes in a bath (without ultrasound). They are then rinsed with water and then dried with a nitrogen blast. In the same way as in Example 1 detailed above, it is verified that the pre-treatment method with this liquid does not degrade the solder bumps. It is also verified using the ToF-SIMS technique that this pre-treatment reduces the thickness of the oxide layer and the amount of carbon contamination initially present on the solder. In the same way as in Example 2, assemblies are made by soldering while waiting less than an hour after having carried out the pre-treatment. A 100% assembly efficiency is obtained and the chips are observed to have no visible residue after dismounting, which validates the effectiveness of the pre-treatment liquid no 3. Moreover, the shear force measured during chip disassembly is greater with this pre-treatment liquid compared to using pre-treatment liquids no 1 and no 2. This result can be attributed to the fact that the pre-treatment liquid no 3 leaves an adsorbed film on the solder which promotes deoxidation of the solder during the high temperature assembly step.

The addition of an acid detergent such as, for example, Neutrax PF from the company Franklab in an amount of 0.8% in the pre-treatment liquid no 3 allows better wetting of the liquid on the components including solder bumps, which allows in particular to ensure good homogeneity of the contact of the liquid on the components and in particular on the solder bumps, while avoiding bubbles. The detergent mentioned as an example in this paragraph is in fact that used to form the pre-treatment liquid no 2, therefore it also allows to participate in the attack of the oxide layer initially present on the solder and in the removal of the organic contamination.

In the example no 4, rinsing the pre-treatment liquid is carried out with water, which is a good solvent from the solutes present in the pre-treatment solution. Thus, only an adsorbed molecular film remains on the solder after rinsing. On the contrary, the components can be rinsed with a poor solvent from the solutes present in the pre-treatment solution, so that a thin film of nanometric thickness (comprised between 1 and 100 nm), thicker than a simple adsorbed film, remains on the treated components and in particular on the solder bumps.

A TEST VEHICLE N° 3 formed of two silicon chips intended to be assembled on top of each other is considered. The first chip includes solder bumps which are copper pillars surmounted by a tin-based solder (Sn 98%, Ag 2%). The pillars are arranged in a square network with a pitch of 30 µm. The total height of the pillars and of the solder dome which surmounts them is 24 µm. The second chip includes metallisation pads, the arrangement of which coincides with the arrangement of the solder bumps of the first chip, to allow them to be assembled when the chips are opposite each other. This second, larger chip will be placed below the first chip during assembly operations.

Figure 6:
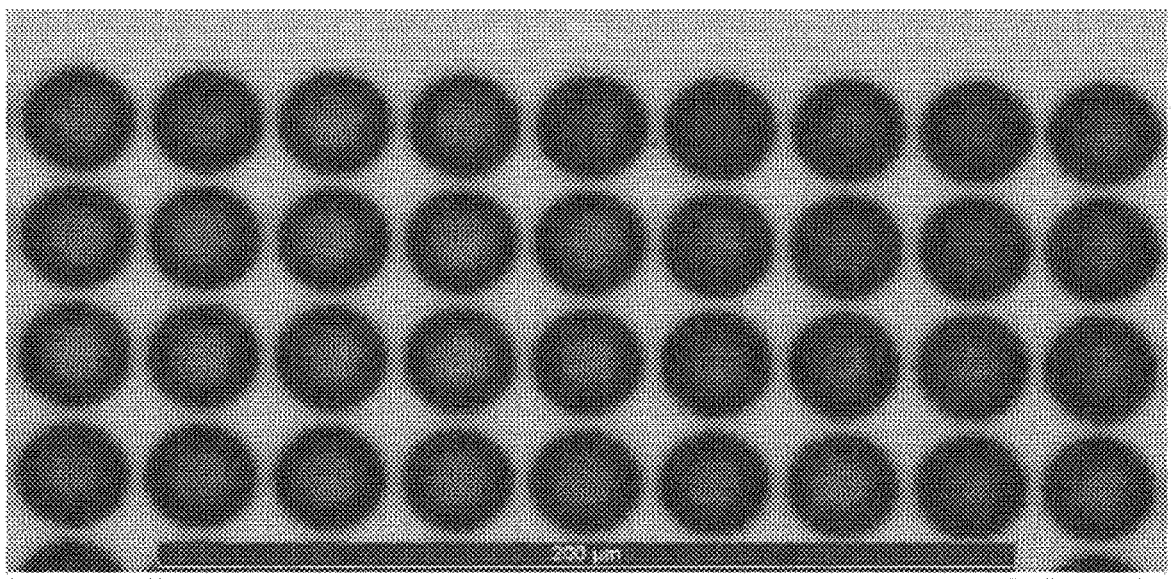
FIG. 6 shows the chip of the test vehicle no 3 which includes solder bumps, photographed after pre-treatment with pre-treatment liquid no 3 and a rinsing with isopropanol (see example no 5 of the text).

In EXAMPLE no 5, the chips of the test vehicle no 3 which include solder bumps are immersed in pre-treatment liquid no 3 for 5 minutes in a bath (without ultrasound). They are then rinsed with isopropanol then dried with a nitrogen blast. By observing the chips treated in this way, one can distinguish a change in the shade of the chips between before and after the treatment. This change in the shade is due to the thin film left by the pre-treatment liquid after the isopropanol rinse. The colour comes from light interference in the film, it is therefore an interference colour. The photograph of FIG. 6 is taken at the edge of the matrix of solder bumps and one can distinguish on the top of the figure a slight variation in the shade in the proximity of the bumps, which characterises a variation in the thickness of the film. The shade taken by the chip is compatible with a film which is a few tens of nanometres thick.

The assembly is then carried out by soldering the chips of test vehicle no 3, within a period of less than 4 hours after the pre-treatment described in the previous paragraph, using the pre-treatment liquid no 3. A levelling of the bumps is carried out by pressing the chip including the solder bumps on the chip including the metallisation pads after the chips and their connectors have been placed opposite each other ("coining" method). The top chip is then released, and a thermal cycle is then carried out, in the ambient air, with a temperature peak at 250° C. for 60 seconds, which ensures the good melting of the solder of the bumps. After cooling, the assemblies are dismounted and the chips are inspected to determine the good wetting of the solder as explained in example no 2. It is noted that the method allows to obtain an assembly efficiency of 100% and not to leave any residue, which validates the effectiveness of the method of this example no 5, using the pre-treatment liquid no 3 and a rinsing with isopropanol. The duration of effectiveness of the treatment was reduced from 1 to 4 hours in comparison with examples no 2 and 4, which leaves more time to complete the assemblies and is therefore a practical advantage. In addition, unlike examples no 2 and 4, the assembly can be done reliably in ambient air (a neutral gas atmosphere is not required), which is another practical advantage. These advantages are provided by the presence of a thin film of nanometric thickness (comprised between 1 and 100 nm) on the surface of the treated components and in particular on the solder bumps.

The invention claimed is:

1. A solder bump assembly method, comprising:
assembling a first component including solder bumps with a second component including connectors,
the assembly of the first and second components being preceded by pre-treating the first and second components wherein the solder bumps are contacted with a pre-treatment liquid configured to at least partially remove an oxide layer initially present on the solder, and
carrying out the assembly of the components after the pre-treatment in the absence of liquid or gas flux,
wherein the pre-treatment liquid is an aqueous solution containing carboxylic acids or polycarboxylic acids.

2. The method according to claim 1, wherein the contacting with the pre-treatment liquid is configured to leave a thin film on a surface of the first and second components, with a thickness less than 100 nm, the thin film having a property of promoting effective soldering without leaving residues after assembly, the method comprising prolonging action of the pre-treatment so that soldering can be done more than one hour after the pre-treatment without reducing the assembly efficiency.

3. The method according to claim 1, the aqueous solution containing amines or polyamines.

4. The method according to claim 1, the aqueous solution containing amino acids or poly amino acids.

5. The method according to claim 1, wherein the pre-treatment liquid is an aqueous solution containing glutamic acid hydrochloride, in a concentration comprised between 10 and 20% by mass.

6. The method according to claim 1, wherein the pre-treatment liquid contains a strong acid in an amount sufficient for the pre-treatment liquid to reach a pH of less than 2.

7. The method according to claim 1, wherein the pre-treatment liquid contains an acid detergent.

8. The method according to claim 1, further comprising rinsing the first and second components immediately after contact with the pre-treatment liquid with a solvent allowing the solubilisation of the solutes present in the pre-treatment liquid at an amount of at least 10%, so that only an adsorbed molecular film remains on the solder.

9. The method according to claim 1, further comprising rinsing the first and second components immediately after contact with the pre-treatment liquid with a solvent allowing dissolution of not more than 0.1% of the solutes present in the pre-treatment liquid, so that a thin film of nanometric thickness comprised between 1 and 100 nm remains on the treated components.

10. The method according to claim 1, further comprising drying the first and second components immediately after contact with the pre-treatment liquid, then washing with a poor solvent from the solutes present in the pre-treatment liquid.

11. The method according to claim 1, wherein the contact with the pre-treatment liquid is made by immersion, and a contact time with the pre-treatment liquid is between 1 and 5 minutes, the assembly by soldering then being carried out less than four hours after the pre-treatment, in a presence of air or under neutral gas.

12. The method according to claim 3, wherein the pre-treatment liquid is a solution containing a basic detergent, the pH of said solution being between 11 and 13.

13. The method according to claim 1, wherein the pre-treatment liquid is a solution containing an acid detergent, the pH of said solution being between 1 and 3.

14. The method according to claim 12 wherein the detergent is non-foaming, the contact with the pre-treatment liquid can be made by immersion, the contact time with the pre-treatment liquid is between 1 and 5 minutes, and the contact with the pre-treatment liquid is followed by rinsing, then by drying, the assembly by soldering then being carried out less one hour after the pre-treatment.

15. The method according to claim 14, wherein
the rinsing is carried out with one of water and isopropanol, and
the drying is carried out under a neutral gas atmosphere.

16. The method according to claim 6, wherein the strong acid is hydrochloric acid, with a concentration comprised between 0.1% and 1% by mass.

17. The method according to claim 8, wherein the solvent is water.

18. The method according to claim 9, wherein the solvent is isopropanol.

19. The method according to claim 10, wherein the solvent is isopropanol.

20. The method according to claim 11, wherein the immersion comprises immersing in an ultrasonic bath.

* * * * *